United States Patent [19]

Cho et al.

[11] 3,969,164

[45] July 13, 1976

[54] NATIVE OXIDE TECHNIQUE FOR PREPARING CLEAN SUBSTRATE SURFACES

[75] Inventors: Alfred Yi Cho, New Providence, N.J.; Joseph Charles Tracy, Jr., Romeo, Mich.

[73] Assignee: Bell Telephone Laboratories, Incorporated, Murray Hill, N.J.

[22] Filed: Aug. 15, 1975

[21] Appl. No.: 605,041

Related U.S. Application Data

[63] Continuation-in-part of Ser. No. 506,346, Sept. 16, 1974, abandoned.

[52] U.S. Cl. .................................. 148/175; 148/174; 156/17; 156/610; 156/612
[51] Int. Cl.² ............. H01L 21/203; H01L 21/306; H01L 21/316
[58] Field of Search .............. 148/174, 175; 156/17, 156/610, 612

[56] References Cited
UNITED STATES PATENTS

| | | | |
|---|---|---|---|
| 3,243,323 | 3/1966 | Corrigan et al. | 148/175 |
| 3,258,359 | 6/1966 | Hugle | 148/174 X |
| 3,316,130 | 4/1967 | Dash et al. | 148/175 |
| 3,600,241 | 8/1971 | Doo et al. | 156/17 X |
| 3,600,242 | 8/1971 | Berkenblit et al. | 148/175 |
| 3,751,310 | 8/1973 | Cho | 148/175 |

OTHER PUBLICATIONS

Cho, et al., "Molecular Beam Epitaxy of GaAs," 1970, Symp. on GaAs, Paper No. 2 (1971) pp. 18–29.
Cho, al., a., "P–N Junction Formation–GaAs," J. Applied Physics, vol. 42, No. 11, Oct. 1971, pp. 4422–4425.
Cho, A. Y., "Morphology of–GaAs–Surface Structures."
Ibid., vol. 41, No. 7, June 1970, pp. 2780–2786.
Cho et al., "Surface Structures–Films of GaAs," Solid State Electronics, vol. 14, 1971, pp. 125–132.
Cho, et al., "Mg–Doped GaAs and $Ga_{1-x}Al_xAs$ by Epitaxy," J. Applied Physics, vol. 43, No. 12, Dec. 1972, pp. 5118–5123.
Larrabee, G. B., "Contamination of Semiconductor Surfaces," J. Electrochem. Soc., vol. 108, No. 12, Dec. 1961, pp. 1130–1134.

*Primary Examiner*—L. Dewayne Rutledge
*Assistant Examiner*—W. G. Saba
*Attorney, Agent, or Firm*—M. J. Urbano

[57] ABSTRACT

Surface contamination of Group III(a)–V(a) substrates prior to epitaxial growth can influence structural, optical, and electrical properties of the resulting layers. Of the common contaminants, sulfur, nitrogen, carbon, and oxygen, which are found on substrate surfaces, only carbon cannot be removed by simple heating. By passivating the substrate surface with a native oxide coating after chemical etching and before atmospheric exposure, the carbon-containing contamination can be virtually eliminated since these compounds have low sticking coefficients on the native oxide. The oxide can then be readily stripped off by heating in a vacuum to leave essentially an atomically clean substrate surface.

1 Claim, No Drawings

NATIVE OXIDE TECHNIQUE FOR PREPARING CLEAN SUBSTRATE SURFACES

CROSS-REFERENCE TO RELATED APPLICATION

This application is a continuation-in-part of my co-pending application, Ser. No. 506,346, filed Sept. 16, 1974, now abandoned.

BACKGROUND OF THE INVENTION

This invention relates to Group III(a)—V(a) compound substrate surface preparation.

Substrate surface contamination prior to epitaxial growth can have deleterious effects on the structural, optical, and electrical properties of the finished device. Substrate surface cleanliness is especially important in molecular beam epitaxy (MBE) where, unlike other techniques such as liquid phase epitaxy or chemical vapor phase deposition, it is impossible to melt or etch back the substrate in situ prior to growth.

Ion sputtering has been used for the purpose of cleaning substrate surfaces, but this procedure should be controlled by a direct surface analysis technique such as Auger electron spectroscopy which is costly, complex, and time consuming. For commercial production it would be desirable to replace ion sputtering with a simpler technique such as heating to cause desorption of absorbed contaminants.

In a prior MBE technique taught by A. Y. Cho in U.S. Pat. No. 3,751,310 issued Aug. 7, 1973, (Case 2) and assigned to the assignee hereof and by Cho and Hayashi in the *Journal of Applied Physics*, Vol. 42, page 4222 (1971), the substrate was polished, mounted in a vacuum chamber, and heated. It was suggested that simply heating prior to growth was sufficient to remove atmospheric contaminants such as CO, from a GaAs substrate.

A more thorough technique as described by Cho and Hayashi, *Solid State Electronics*, Vol. 14, pages 125–132 (1971) involved first lapping the substrate on bromine-methanol soaked lens paper and then dipping it in bromine-methanol after which the substrate was rinsed with pure methanol and water. Substrates prepared in this manner exhibited surface defects which were attributed to such factors as oven contamination or faulty etching. However, the actual source of the problem was the atmospheric contamination, carbon-containing gases in particular, to which the substrate was exposed. This exposure resulted from rapid evaporation of the methanol between the etchant dip and the water rinse which would have formed a native oxide coating.

SUMMARY OF THE INVENTION

We have found that carbon containing gases have a sticking coefficient approaching unity on Group III(a)—V(a) compound substrate surfaces, especially GaAs, and because of the low vapor pressure of carbon cannot be desorbed at a temperature below the congruent evaporation temperature of GaAs (~ 650°C). More specifically, after a substrate has been etch-polished, atmospheric contaminants adhere readily to the freshly cleaned substrate surface because of their high sticking coefficients. We have found through Auger electron spectroscopy studies that these carbon containing gases have a low sticking coefficient to a native oxide. In accordance with one embodiment of the invention, by applying a passivating native oxide coating after chemical etching and before atmospheric exposure, carbon containing contamination can be greatly reduced. The native oxide is then easily removed by heating the substrate in a vacuum leaving essentially an atomically clean substrate surface.

In a preferred embodiment of the invention, the substrate remains submerged from the beginning of the etch until after the application of the native oxide coating. Each successive step is carried out by diluting the prior component, e.g., a solvent is added to the etchant to stop the etching action and then an oxidant is added to the solvent to cause formation of a thin native oxide coating.

This preparative technique has been employed in the fabrication of several semiconductor devices, such as GaAs double heterostructure junction lasers, mixer diodes, and IMPATT diodes. The simplicity and effectiveness of this technique render it more readily adaptable to commercial use than prior art techniques.

DETAILED DESCRIPTION

General Technique

The first step in an illustrative embodiment of the inventive technique involves orienting a Group III(a)—V(a) compound substrate along a suitable crystal plane and saw cutting to obtain slices. These slices are polished with diamond paste to remove the saw cut damage and then further polished in a chemical etchant, such as a solution of bromine-methanol, chlorine-methanol, or aqueous sulphuric acid-peroxide. An appropriate solvent is added to dilute the etchant and thereby virtually stop the etch process.

In accordance with the invention, a thin, passivating native oxide coating must be formed on the substrate surface before it is exposed to atmospheric contamination. The preferred means of accomplishing this is to add the oxidant to the solvent until the solution is virtually pure oxidant. If, for example, water is the oxidant, exposure can range between about ten seconds to a half hour, with ten minutes being typical. The time, however, is not critical because the first monolayer of the oxide forms very rapidly on the substrate surface but succeeding layer formation decreases exponentially. The layer of native oxide prevents a layer of carbon-containing (or other) contaminants from forming on the substrate surface. This is desirable since the oxide can be removed easily by heating in a vacuum whereas the carbon-containing contamination cannot.

After the native oxide is formed, the liquid oxidant is removed from the substrate surface immediately by a stream of gas such as dried freon or nitrogen to prevent any particulate matter contained in the oxidant from precipitating onto the surface. Alternatively, the oxidant can be removed by spin-drying the substrate. Gaseous oxygen could also be used to further oxidize and dry simultaneously. In any case, the substrate can now be handled in the atmosphere with substantially less possibility of being contaminated by carbon containing gases.

For example, if the substrate is to be subjected to epitaxial growth by molecular beam epitaxy, it is mounted in a vacuum chamber of the type disclosed by A. Y. Cho and F. K. Reinhart in copending application Ser. No. 373,023 filed on June 25, 1973 and assigned to the assignee hereof. The chamber is pumped down to a pressure on the order of $10^{-8}$ torr. Now the substrate is heated from room temperature to somewhere between approximately 530° to 550°C to cause desorption of the native oxide layer. The time for desorption depends on layer thickness and oxide composition. A thin layer will desorb rapidly at about 530°C. The ability of the electron beam of a high energy diffraction system to penetrate through the oxide coating giving diffraction of the underlying substrate material allowed us to estimate the oxide layer thickness as typically less than 50 Angstroms. At the desorption and growth temperatures, the sticking coefficient of any remaining deleterious contaminants not removed by evacuation is low enough that the clean surface will remain so.

The following examples are given by way of illustration only and are not to be construed as limitations of the many variations possible within the scope of the invention. In these examples electrical properties of the resulting layers were determined by Hall effect measurements, optical properties were measured by photoluminescence, and the morphology was studied by phase contrast microscopy.

EXAMPLE I

This example describes a process for the growth of an epitaxial n-type layer of gallium arsenide doped with silicon on an n-type gallium arsenide substrate doped with tellurium or silicon to $2 \times 10^{18}/cm^3$.

A gallium arsenide substrate obtained from commercial sources was cut along the (100) plane to dimensions of about 2.0 cm × 2.0 cm × 0.0625 cm. The substrate was initially polished with diamond paste by conventional mechanical polishing techniques and then lapped with particle-free lens paper soaked in $Br_2$—$CH_3OH$. The substrate was then further etch-polished by submerging it in a solution of five drops $Br_2$ to 30 cc $CH_3OH$. To avoid atmospheric exposure, the substrate was left in the $Br_2$—$CH_3OH$ and pure $CH_3OH$ was added to dilute the etchant and stop the etching action. Again, in order to avoid exposing the substrate to the atmosphere, the substrate was left submerged in the $CH_3OH$ which was then diluted with deionized water in order to form a thin native oxide coating. The substrate was dried in a stream of dry freon so that the water was immediately blown off to avoid precipitation onto the surface of any particulate matter, such as dust, contained in the water. Next, the substrate was mounted on a molybdenum heating block and inserted in an apparatus of the type described in A. Y. Cho and F. K. Reinhart Ser. No. 373,023 supra. Three guns were contained in the gun port to hold gallium, arsenic, and silicon. The vacuum chamber was evacuated to a pressure of $5 \times 10^{-7}$ torr with a background pressure of arsenic. The substrate was heated to about 550°C to cause desorption of the oxide and provide a clean growth surface and then raised to the growth temperature of 580°C. Liquid nitrogen was introduced into the cooling shroud and the guns were heated so that the gallium gun was about 980°C, the arsenic gun was about 320°C, the silicon gun was about 1170°C resulting in vaporization of the materials therein and the consequent formation of molecular beams. The beams were directed toward the substrate surface for about five hours resulting in the growth of an n-type epitaxial layer of gallium arsenide about 5μm thick. Conductivity type, carrier concentration and electron mobility were determined by well known Hall effect measurements, as n-type, $1.5 \times 10^{18}/cm^3$ and 2350 $cm^2/V.sec$, respectively. No growth induced features were detected on the surface morphology by phase contrast microscopy.

EXAMPLE II

This example demonstrates the growth of an epitaxial n-type layer of gallium arsenide doped with silicon on an n-type gallium arsenide substrate doped with Te or Si to $2 \times 10^{18}/cm^3$ as in Example I. All process steps remained the same as in the first example. However, the etch procedure was modified such that following the $Br_2$—$CH_3OH$ etch-polish, the substrate was dipped in an $H_2SO_4$ — $H_2O_2$ — $H_2O$ solution in a 4:1:1 (or 8:1:1) volume ratio.

Atmospheric exposure is permissible in the transfer from $Br_2$ — $CH_3OH$ to the $H_2SO_4$ — $H_2O_2$ — $H_2O$ solution since the aqueous $H_2SO_4$ — $H_2O_2$ further etches the substrate. However, once the etch has been completed, it is important not to allow the substrate to contact the atmosphere. So, the substrate was left submerged in the etchant and then deionized water was added to dilute the aqueous $H_2SO_4$—$H_2O_2$ solution and consequently virtually stop the etch process while simultaneously forming the native oxide. The resulting layer was n-type doped with Si to $1.5 \times 10^{18}/cm^3$ with an electron mobility of 2350 $cm^2/V.sec$. The surface morphology was featureless.

EXAMPLE III

This example illustrates the growth of an n-type aluminum gallium arsenide ($Al_{0.25}Ga_{0.75}As$) layer 5μm thick doped with Sn on an n-type gallium arsenide substrate doped with Te or Si to $2 \times 10^{18}/cm^3$ following the procedure outlined in Example I. The substrate temperature was maintained at about 580°C and the guns were maintained at about 1325°C for aluminum, 775°C for tin, 980°C for gallium and 320°C for arsenic. The n-type carrier concentration of the grown layer was $8 \times 10^{17}/cm^3$ and the electron mobility was about 2000 $cm^2/V.sec$. The morphology was featureless.

EXAMPLE IV

Using a molecular beam epitaxial technique described by H. C. Casey, Jr., A. Y. Cho and M. B. Panish in copending application, Ser. No. 477,975 filed June 10, 1974 and assigned to the assignee hereof, a double heterostructure junction laser was fabricated. The laser comprised an n-type gallium arsenide substrate doped with Si or Te to $2 \times 10^{18}/cm^3$ with the following contiguous layers grown thereon in the order recited: a GaAs buffer layer 2.0μm thick and doped $n^+$-type with Sn to $1 \times 10^{18}/cm^3$; an $Al_{0.25}Ga_{0.75}As$ layer 1.5μm thick doped n-type with Sn to $5 \times 10^{17}/cm^3$; a GaAs layer 0.53μm thick doped p-type with Mg to $5 \times 10^{16}/cm^3$; an $Al_{0.25}Ga_{0.75}As$ layer 2.3μm thick doped p-type with Mg to about $1 \times 10^{18}/cm^3$; and a GaAs layer 0.5μm thick doped p-type with Mg to about $5 \times 10^{16}/cm^3$. The threshold current density $J_{th}$ at room temperature (297°K) was $4.0 \times 10^3$ $A.cm^2$ after annealing as taught by Casey, Cho, and Panish Ser. No. 477,975, supra. The wavelength of operation was 0.9 micrometers.

EXAMPLE V

This example describes the growth of epitaxial layer of gallium phosphide on a gallium phosphide substrate. Following the procedures of Example I, a gallium phosphide substrate obtained from commercial sources was cut along the (1 1 1) plane and etch-polished with $Cl_2$—$CH_3OH$ rather than $Br_2$—$CH_3OH$. The gallium phosphide gun was maintained at about 880°C and the substrate temperature was about 580°C. A layer of gallium phosphide 5μm thick was grown on the gallium phosphide substrate at a rate of 0.5μm/hr. The morphology of this layer was smooth and showed no growth induced features when studied by phase contrast microscopy.

It is to be understood that the above described examples are merely illustrative of the many possible specific embodiments which can be devised to represent application of the principles of the invention. Numerous and varied arrangements can be devised with these principles by those skilled in the art without departing from the spirit and scope of the invention. This preparative technique is adaptable to other epitaxial growth techniques, such as liquid phase epitaxy or chemical vapor phase deposition and can be applied to Group III(a)-V(a) compounds in general. Peroxide, water, and a variety of other oxidants as well as a variety of etchants can be utilized to obtain the same end result while applying the principles of this invention.

What is claimed is:

1. A method of preparing a gallium arsenide substrate surface for molecular beam epitaxy comprising the steps of: a) etch-polishing the substrate surface by submerging it in bromine-methanol; b) while said substrate is still submerged in said bromine-methanol, diluting said bromine-methanol with pure methanol effective to virtually stop the etching action of said bromine-methanol; c) while said substrate is still submerged in said methanol, forming a native oxide coating on said surface by diluting said methanol with deionized water; d) drying said substrate with a stream of dried freon effective to remove the water before any particulate matter contained therein can precipitate on the surface; e) mounting said substrate in an evacuable chamber of an apparatus adapted for molecular beam epitaxy; f) reducing pressure of said chamber; g) heating said substrate to a temperature sufficient to remove said native oxide coating; and h) growing at least one epitaxial layer on said substrate surface.

* * * * *

UNITED STATES PATENT AND TRADEMARK OFFICE
CERTIFICATE OF CORRECTION

PATENT NO. : 3,969,164

DATED : July 13, 1976

INVENTOR(S) : Alfred Yi Cho and Joseph Charles Tracy, Jr.

It is certified that error appears in the above-identified patent and that said Letters Patent are hereby corrected as shown below:

Column 4, line 15, "$H2O_2$" should read --$H_2O_2$--.

Column 4, line 67, "(1 1 1)" should read --($\bar{1}\,\bar{1}\,\bar{1}$)--.

Signed and Sealed this

Nineteenth Day of October 1976

[SEAL]

Attest:

RUTH C. MASON
*Attesting Officer*

C. MARSHALL DANN
*Commissioner of Patents and Trademarks*